US008988894B2

(12) United States Patent
Lin

(10) Patent No.: US 8,988,894 B2
(45) Date of Patent: Mar. 24, 2015

(54) ELECTRONIC DEVICE

(75) Inventor: Ching-Chi Lin, New Taipei (TW)

(73) Assignee: Acer Incorporated, New Taipei (TW)

( * ) Notice: Subject to any disclaimer, the term of this patent is extended or adjusted under 35 U.S.C. 154(b) by 223 days.

(21) Appl. No.: 13/591,234

(22) Filed: Aug. 22, 2012

(65) Prior Publication Data

US 2013/0342973 A1 Dec. 26, 2013

(30) Foreign Application Priority Data

Jun. 25, 2012 (TW) ............................. 101122647 A

(51) Int. Cl.
*H05K 7/14* (2006.01)
*H01Q 7/00* (2006.01)
*H01Q 13/10* (2006.01)

(52) U.S. Cl.
CPC . *H01Q 7/00* (2013.01); *H01Q 13/10* (2013.01)
USPC ...................................... 361/799; 361/679.01

(58) Field of Classification Search
USPC ............................................ 361/799, 679.01
See application file for complete search history.

(56) References Cited

U.S. PATENT DOCUMENTS 5,754,143 A * 5/1998 Warnagiris et al. ........... 343/767
6,011,698 A * 1/2000 Buehler ........................ 361/799
7,453,404 B2 * 11/2008 Ying ............................. 343/702
2004/0104851 A1 6/2004 Kadambi et al.
2005/0088342 A1 4/2005 Parsche
2006/0023872 A1 * 2/2006 Chang ........................... 379/440
2009/0160717 A1 * 6/2009 Tsutsumi et al. ............. 343/726
2009/0256763 A1 10/2009 Chi et al.
2010/0283694 A1 * 11/2010 Kato ............................. 343/730
2011/0128206 A1 * 6/2011 Wakabayashi ................ 343/860
2012/0218723 A1 * 8/2012 Kwak et al. .................. 361/748

FOREIGN PATENT DOCUMENTS

CN 101466214 6/2009
EP 2006995 12/2008
EP 2157665 2/2010

OTHER PUBLICATIONS

Lee et al., "Design of Small-Size Wide-Bandwidth Microstrip-Patch Antennas," IEEE Antennas and Propagation Magazine, Feb. 1, 2003, pp. 75-83, vol. 45, No. 1.
Wong et al., "Broadband Triangular Microstrip Antenna with U-shaped slot," Electronics Letters, Dec. 4, 1997, pp. 2085-2087, vol. 33, No. 25.

* cited by examiner

*Primary Examiner* — Forrest M Phillips
(74) *Attorney, Agent, or Firm* — Jianq Chyun IP Office

(57) ABSTRACT

An electronic device is provided. The electronic device includes a metal housing, a first opening, a first metal line, a first grounding point and a first current zero point. The first opening passes through the metal housing. The first metal line is disposed inside the first opening, wherein a first end of the first metal line is electrically connected to a side of the first opening, and a second end of the first metal line has a first feeding point. The first grounding point and the first current zero point are located on the side of the first opening. The metal housing forms a first loop antenna to transmit or receive a first radio frequency signal by a first excitation path from the first feeding point to the first grounding point.

10 Claims, 3 Drawing Sheets

10

ELECTRONIC DEVICE

CROSS-REFERENCE TO RELATED APPLICATION

This application claims the priority benefit of Taiwan application serial no. 101122647, filed on Jun. 25, 2012. The entirety of the above-mentioned patent application is hereby incorporated by reference herein and made a part of this specification.

BACKGROUND OF THE INVENTION

1. Field of the Invention

The invention relates to an electronic device, and more particularly relates to an electronic device with a loop antenna.

2. Description of Related Art

As technology advances, electronic devices, such as smart phones, tablet PCs, notebook PCs, etc., are developing to be thinner and lighter. Moreover, in order to draw the attention of the consumers, electronic devices today are mostly equipped with metal back covers to improve the uniqueness and appearance design thereof.

For the purpose of miniaturization, the antenna of the electronic device is usually formed directly on an outer surface of a plastic housing by LDS (laser direct structuring) technology, so as to obtain effective radiation space for the antenna. However, such a design requires higher production costs. Besides, due to the appearance design with metallic sense, an additional antenna window needs to be formed on the metal back cover of the electronic device, so that the antenna configured on the metal housing can have better radiation efficiency. However, such a configuration may ruin the overall design of the appearance.

In other words, it is a big challenge to design an electronic device that not only satisfies the requirements for miniaturization and appearance design but also reduces production costs and maintains antenna radiation efficiency.

SUMMARY OF THE INVENTION

The invention provides an electronic device which uses an opening and a metal line in a metal housing to form an excitation path of a loop antenna and utilizes the metal housing to improve the appearance design of the electronic device.

The invention provides an electronic device which includes a metal housing, a first opening, a first metal line, a first grounding point, and a first current zero point. The first opening passes through the metal housing. The first metal line is disposed inside the first opening, wherein a first end of the first metal line is electrically connected to a side of the first opening, and a second end of the first metal line includes a first feeding point. The first grounding point and the first current zero point are disposed on the side of the first opening, wherein the metal housing forms a first loop antenna to transmit or receive a first radio frequency signal by a first excitation path from the first feeding point to the first grounding point.

In an embodiment of the invention, the electronic device further includes a second opening, a second metal line, a second grounding point, and a second current zero point. The second opening passes through the metal housing. The second metal line is disposed inside the second opening, wherein a first end of the second metal line is electrically connected to a side of the second opening, and a second end of the second metal line includes a second feeding point. The second grounding point and the second current zero point are disposed on the side of the second opening, wherein the metal housing forms a second loop antenna to transmit or receive a second radio frequency signal by a second excitation path from the second feeding point to the second grounding point.

In an embodiment of the invention, the metal housing, the first metal line, and the second metal line are integrally formed.

Based on the above, the invention uses the opening on the metal housing and the metal line in the opening to form the excitation path of the loop antenna. Accordingly, the metal housing can satisfy the requirement of appearance design, and furthermore the electronic device can utilize the metal housing to receive or transmit radio frequency signals to maintain the radiation efficiency of the antenna. In addition, because the metal housing and the metal line are integrally formed, the appearance quality of the electronic device is further improved and the production costs thereof are reduced.

In order to make the aforementioned features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

Figure 1:
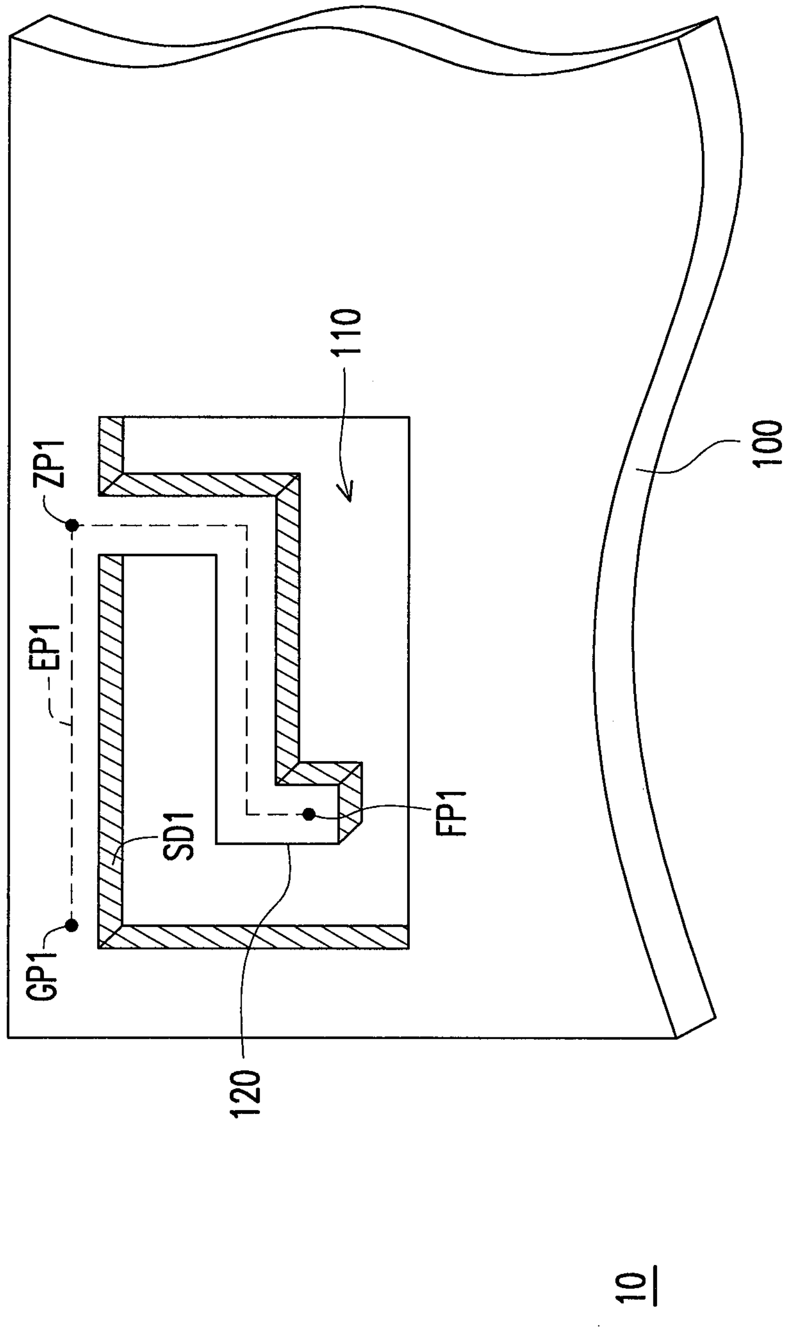
FIG. 1 is a schematic view of a part of an electronic device according to an embodiment of the invention.

FIG. 1 is a schematic view of a part of an electronic device according to an embodiment of the invention. Referring to FIG. 1, an electronic device 10 includes a metal housing 100, a first opening 110, a first metal line 120, a first grounding point GP1, a first current zero point ZP1, and a first feeding point FP1. Herein, the first opening 110 passes through the metal housing 100. The first metal line 120 is disposed inside the first opening 110. In addition, a first end of the first metal line 120 is electrically connected to a side SD1 of the first opening 110, and a second end of the first metal line 120 includes the first feeding point FP1. In this embodiment, the metal housing 100 is a back cover of the electronic device 10, for example, and the first metal line 120 and the metal housing 100 are integrally formed. However, it should be noted that the invention is not limited thereto.

The first grounding point GP1 and the first current zero point ZP1 are located on the side SD1 of the first opening 110. Herein, the metal housing 100 forms a first loop antenna to transmit or receive a first radio frequency signal by a first excitation path EP1 from the first feeding point FP1 to the first grounding point GP1. Herein, the first loop antenna is a half-wavelength loop antenna, for example, and thus a length of the first excitation path EP1 is a half of a wavelength of the first radio frequency signal, for example. In addition, it is known from the characteristics of the loop antenna that the first excitation path EP1 has the first current zero point ZP1 thereon.

Figure 2:
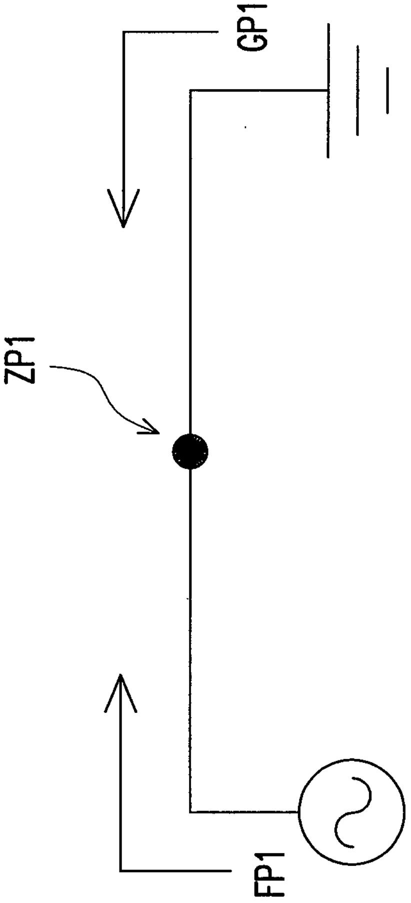
FIG. 2 illustrates an excitation path of a loop antenna according to an embodiment of the invention.

For instance, FIG. 2 illustrates the excitation path of the loop antenna according to an embodiment of the invention. As indicated by the arrow in FIG. 2, a current is fed to the half-wavelength loop antenna via the first feeding point FP1. Moreover, the current from the first feeding point FP1 and an excitation current from a system ground plane are reverse to each other. Therefore, the first current zero point ZP1 is formed on the excitation path from the first feeding point FP1 to the first grounding point GP1. In addition, the first current zero point ZP1 is located approximately at a center of the first excitation path EP1. That is, in this embodiment, a distance from the first current zero point ZP1 to the first grounding point GP1 is a quarter of the wavelength of the first radio frequency signal, for example. The first current zero point ZP1 on the excitation path EP1 is located near a juncture between the first end of the first metal line 120 and the side SD1, for example.

It is noted that, in this embodiment, the metal housing 100 is electrically connected to the system ground plane (not shown) in the electronic device 10. Moreover, in actual application, the electronic device 10 can transmit a signal from the first feeding point FP1 to a transceiver therein (not shown) via a coaxial line (not shown), wherein an inner conductor of the coaxial line is electrically connected to the first feeding point FP1, and an outer conductor of the coaxial line is electrically connected to the system ground plane. Besides using the coaxial line to feed the signal, the electronic device 10 can use a conductive element, such as a contact spring or a pogo pin, to replace the coaxial line and reduce transmission loss of the signal.

FIG. 1 illustrates examples of the shapes of the first opening 110 and the first metal line 120 in this embodiment, but it should be noted that the invention is not limited thereto. Persons skilled in the art may adjust the shapes of the first opening 110 and the first metal line 120 according to the frequency and impedance matching of the first radio frequency signal they need. Specifically, the first opening 110 has a rectangular shape or an irregular geometrical shape, and the first metal line 120 has a strip shape or an irregular geometrical shape, for example.

Figure 3:
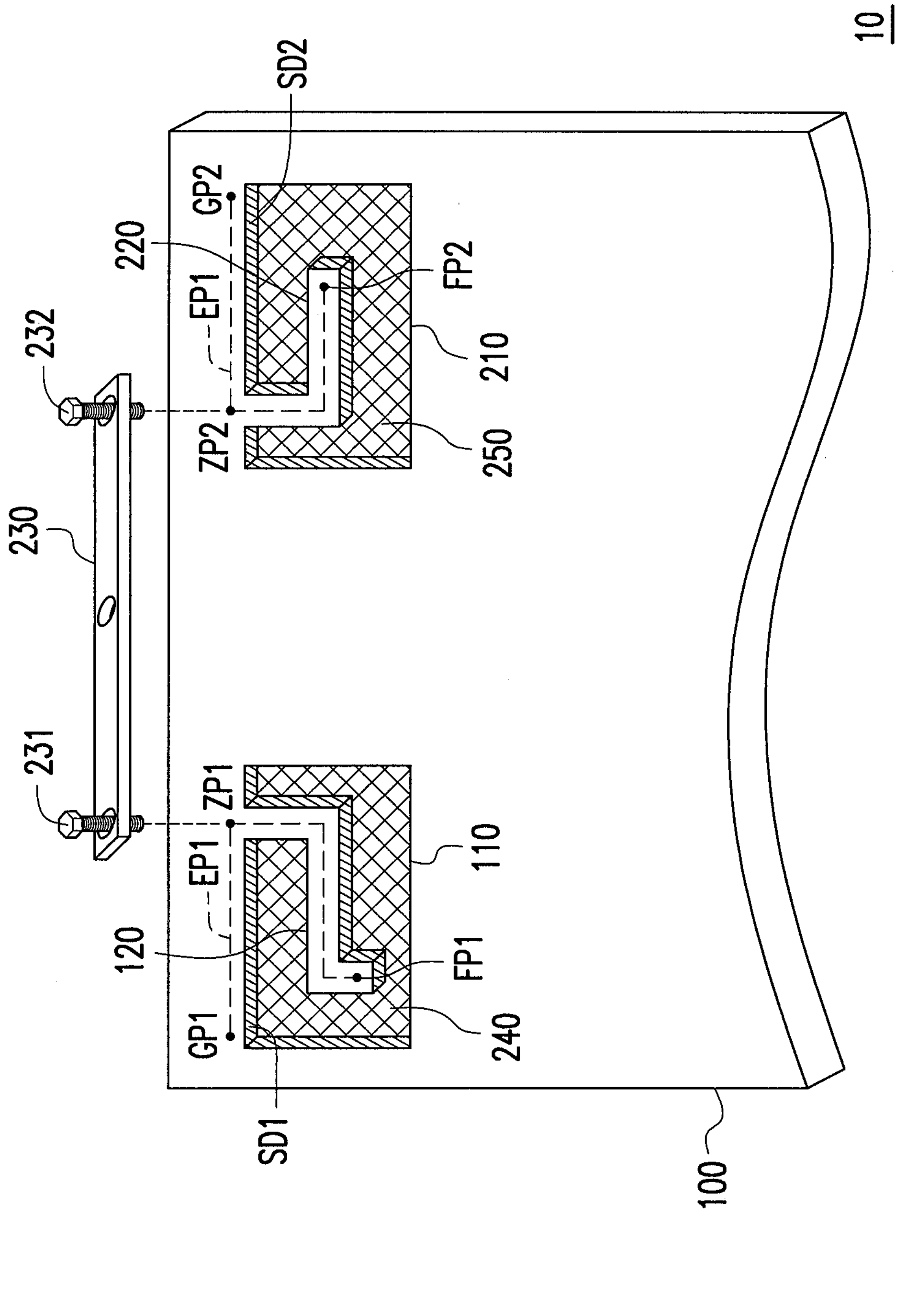
FIG. 3 is a schematic view of a part of an electronic device according to another embodiment of the invention.

In another embodiment of the invention, the electronic device 10 further forms a plurality of loop antennas by the metal housing. For instance, FIG. 3 is a schematic view of a part of an electronic device according to another embodiment of the invention. In comparison with the embodiment of FIG. 1, the electronic device 10 of FIG. 3 further includes a second opening 210, a second metal line 220, a second grounding point GP2, a second current zero point ZP2, and a second feeding point FP2.

As shown in FIG. 3, the second opening 210 passes through the metal housing 100. The second metal line 220 is disposed inside the second opening 210. In addition, a first end of the second metal line 220 is electrically connected to a side SD2 of the second opening 210, and a second end of the second metal line 220 includes the second feeding point FP2. Accordingly, the metal housing 100 forms a second loop antenna to transmit or receive a second radio frequency signal by a second excitation path EP2 between the second grounding point GP2 and the second feeding point FP2. In addition, a length of the second excitation path EP2 is a half of a wavelength of the second radio frequency signal, and a distance from the second current zero point ZP2 to the second grounding point GP2 is a quarter of the wavelength of the second radio frequency signal, for example.

Similar to the embodiment of FIG. 1, the metal housing 100, the first metal line 120, and the second metal line are 220 integrally formed. Moreover, persons skilled in the art may adjust the shapes of the second opening 210 and the second metal line 220 according to the frequency and impedance matching of the second radio frequency signal they need. Furthermore, the electronic device 10 can transmit a signal from the second feeding point FP2 to a transceiver therein through a conductive element, such as a coaxial line, a contact spring, or a pogo pin.

It should be noted that the electronic device 10 can form two loop antennas to operate in different frequencies by the first excitation path EP1 and the second excitation path EP2. In an exemplary embodiment of the invention, the metal housing 100 forms the first loop antenna that operates in 2.4 GHz by the first excitation path EP1 and forms the second loop antenna that operates in 5 GHz by the second excitation path EP2, for example. However, it should be noted that the invention is not limited thereto.

Further, in another exemplary embodiment of the invention, the electronic device 10 also includes a function module 230, as illustrated in FIG. 3. The function module 230 is a camera module, for example. Herein, the function module 230 is fixed to the metal housing 100 by fastening elements 231 and 232. It should be noted that, even if the current zero point of the loop antenna is connected to other metal elements nearby, a resonance mode of the loop antenna is not affected. Therefore, the fastening elements 231 and 232 are configured respectively corresponding to the first current zero point ZP1 and the second current zero point ZP2. That is, in actual application, the metal housing 100 further includes two openings (not shown), which respectively pass through the parts of the metal housing 100 that correspond to the first current zero point ZP1 and the second current zero point ZP2. Accordingly, the fastening elements 231 and 232 respectively pass through the two openings to fix the function module 230 to the metal housing 100.

It is worth mentioning that, in the embodiment of FIG. 3, the electronic device 10 further includes decorative thin films 240 and 250 to improve the appearance design of the electronic device 10. The decorative thin films 240 and 250 respectively fill the first opening 110 and the second opening 210. Moreover, the decorative thin films 240 and 250 can be formed to have an appearance of metallic sense, so as to maintain the uniformity of the appearance of the metal housing 100.

In conclusion of the above, the invention provides an electronic device that uses the opening on the metal housing and the metal line in the opening to form the excitation path of the loop antenna. Accordingly, the metal housing satisfies the requirement of appearance design, and furthermore the electronic device can utilize the metal housing to receive or transmit radio frequency signals to maintain the radiation efficiency of the antenna. The combination of the antenna and the housing also helps miniaturize the electronic device. In addition, because the metal housing and the metal line are integrally formed, the appearance quality of the electronic device is further improved and the production costs thereof are reduced.

It will be apparent to those skilled in the art that various modifications and variations can be made to the structure of the disclosed embodiments without departing from the scope or spirit of the disclosure. In view of the foregoing, it is intended that the disclosure covers modifications and variations of this disclosure provided that they fall within the scope of the following claims and their equivalents.

What is claimed is:

1. An electronic device, comprising:

a metal housing;

a first opening, passing through the metal housing;

a first metal line, disposed inside the first opening, wherein a first end of the first metal line is electrically connected to a side of the first opening, and a second end of the first metal line comprises a first feeding point; and a first grounding point and a first current zero point, disposed on the side of the first opening, wherein the metal housing forms a first loop antenna to transmit or receive a first radio frequency signal by a first excitation path from the first feeding point to the first grounding point.

2. The electronic device according to claim 1, wherein a length of the first excitation path is a half of a wavelength of the first radio frequency signal.

3. The electronic device according to claim 1, wherein the first current zero point is configured on the first excitation path, and a distance from the first current zero point to the first grounding point is a quarter of the wavelength of the first radio frequency signal.

4. The electronic device according to claim 1, further comprising:

a first decorative thin film, configured to fill the first opening.

5. The electronic device according to claim 1, further comprising:

a second opening, passing through the metal housing;

a second metal line, disposed inside the second opening, wherein a first end of the second metal line is electrically connected to a side of the second opening, and a second end of the second metal line comprises a second feeding point; and a second grounding point and a second current zero point, disposed on the side of the second opening, wherein the metal housing forms a second loop antenna to transmit or receive a second radio frequency signal by a second excitation path from the second feeding point to the second grounding point.

6. The electronic device according to claim 5, wherein a length of the second excitation path is a half of a wavelength of the second radio frequency signal.

7. The electronic device according to claim 5, wherein the second current zero point is configured on the second excitation path, and a distance from the second current zero point to the second grounding point is a quarter of the wavelength of the second radio frequency signal.

8. The electronic device according to claim 5, further comprising:

a function module, fixed to the metal housing by a first fastening element and a second fastening element, wherein the first fastening element and the second fastening element respectively correspond to the first current zero point and the second current zero point.

9. The electronic device according to claim 5, further comprising:

a second decorative thin film, configured to fill the second opening.

10. The electronic device according to claim 5, wherein the metal housing, the first metal line, and the second metal line are integrally formed.

* * * * *